United States Patent
Yagyu et al.

(10) Patent No.: US 9,640,703 B2
(45) Date of Patent: May 2, 2017

(54) AVALANCHE PHOTODIODE

(75) Inventors: Eiji Yagyu, Tokyo (JP); Eitaro Ishimura, Tokyo (JP); Masaharu Nakaji, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 1576 days.

(21) Appl. No.: 11/666,091

(22) PCT Filed: Oct. 25, 2004

(86) PCT No.: PCT/JP2004/015794
§ 371 (c)(1),
(2), (4) Date: Nov. 19, 2007

(87) PCT Pub. No.: WO2006/046276
PCT Pub. Date: May 4, 2006

(65) Prior Publication Data
US 2008/0121867 A1    May 29, 2008

(51) Int. Cl.
*H01L 31/107* (2006.01)
*H01L 31/0352* (2006.01)

(52) U.S. Cl.
CPC .... *H01L 31/1075* (2013.01); *H01L 31/03529* (2013.01); *H01L 31/035281* (2013.01); *Y02E 10/50* (2013.01)

(58) Field of Classification Search
USPC .................................. 257/21, 186, E31.063
(Continued)

(56) References Cited

U.S. PATENT DOCUMENTS 4,410,903 A * 10/1983 Wieder .............................. 315/3
4,470,060 A * 9/1984 Yamazaki ....................... 349/46
(Continued)

FOREIGN PATENT DOCUMENTS

EP    1811578    * 7/2007    ............. H01L 31/10
JP    02228077 A  * 9/1990    ............. H01L 31/10
(Continued)

OTHER PUBLICATIONS

Abstract of Terakado in English.*
(Continued)

*Primary Examiner* — Hrayr A Sayadian
(74) *Attorney, Agent, or Firm* — Oblon, McClelland, Maier & Neustadt, L.L.P.

(57) ABSTRACT

In an avalanche photodiode provided with a substrate including a first electrode and a first semiconductor layer, formed of a first conductivity type, which is connected to the first electrode, the configuration is in such a way that, at least an avalanche multiplication layer, a light absorption layer, and a second semiconductor layer having a bandgap that is larger than that of the light absorption layer are layered on the substrate; a second conductivity type conductive region is formed in the second semiconductor layer; and the second conductivity type conductive region is arranged so as to be connected to a second electrode. With the foregoing configuration, an avalanche photodiode having a small dark current and a high long-term reliability can be provided with a simple process.

Additionally, the configuration is in such a way that, by removing at least the light absorption layer among the layers which are layered on the peripheral portion, of the substrate, on which the second conductivity type conductive region and the second semiconductor layer around the second conductivity type conductive region are surrounded by that layers, a side face of the light absorption layer is formed. With the configuration, the dark current can be further reduced.

8 Claims, 10 Drawing Sheets

(58) Field of Classification Search
IPC ............... H01L 31/035281,31/1075, 31/03529; Y02E 10/50
See application file for complete search history.

(56) References Cited

U.S. PATENT DOCUMENTS

| | | | | |
|---|---|---|---|---|
| 4,660,208 | A | * | 4/1987 | Johnston et al. .......... 372/46.01 |
| 4,949,144 | A | * | 8/1990 | Kuroda et al. ................. 257/185 |
| 4,982,255 | A | * | 1/1991 | Tomita ................ H01L 31/1075 257/186 |
| 5,001,335 | A | * | 3/1991 | Takaoka et al. .............. 257/199 |
| 5,138,416 | A | * | 8/1992 | Brillson ......................... 257/440 |
| 5,880,489 | A | * | 3/1999 | Funaba ................. H01L 31/105 257/184 |
| 6,036,769 | A | * | 3/2000 | Spurdens et al. .................. 117/2 |
| 6,720,588 | B2 | | 4/2004 | Vickers |
| 2002/0195616 | A1 | * | 12/2002 | Bond ................... H01L 31/1075 257/186 |
| 2003/0052390 | A1 | * | 3/2003 | Hiraoka ............ H01L 31/03042 257/623 |
| 2003/0137026 | A1 | * | 7/2003 | Park .............................. 257/481 |
| 2004/0251483 | A1 | | 12/2004 | Ko et al. |
| 2005/0156192 | A1 | | 7/2005 | Ko et al. |
| 2007/0137698 | A1 | * | 6/2007 | Wanlass ................ H01L 31/042 136/261 |
| 2008/0121867 | A1 | * | 5/2008 | Yagyu et al. ..................... 257/21 |

FOREIGN PATENT DOCUMENTS

| | | | | |
|---|---|---|---|---|
| JP | 03 109779 | | 5/1991 | |
| JP | 03 291979 | | 12/1991 | |
| JP | 04 296066 | | 10/1992 | |
| JP | 05 129638 | | 5/1993 | |
| JP | 07 202252 | | 8/1995 | |
| JP | 7 312442 | | 11/1995 | |
| JP | 10-65201 | | 3/1998 | |
| JP | 10 313131 | | 11/1998 | |
| JP | 11 121785 | | 4/1999 | |
| JP | 2002 324911 | | 11/2002 | |
| JP | 2004-31707 | | 1/2004 | |
| JP | 2004-200302 | | 7/2004 | |
| WO | WO 2006/046276 | * | 5/2006 | ............. H01L 31/10 |
| WO | WO 2006046276 A1 | * | 5/2006 | ............. H01L 31/10 |

OTHER PUBLICATIONS

U.S. Appl. No. 11/914,871, filed Nov. 19, 2007, Yagyu, et al.
Chinese Office Action issued Jul. 1, 2011, in Japanese Application No. 03-291979, filed Dec. 24, 1991. (With Partial English Translation).
U.S. Appl. No. 13/160,286, filed Jun. 14, 2011, Yagyu, et al.
Office Action issued Aug. 23, 2011 in Japan Application No. 2007-264391 (WIth English Translation).
Mitsubishi Electric Powerpoint presentation document; OThG2 Recent Advances in Allnas Avalanche Photodiodes to the Market; Mar. 29, OFC2007 at Anaheim; 30 pages.
Eiji Yagyu, et al.; Design and Characteristics of Guardring-Free Planar AlInAs Avalanche Photodiodes; Journal of Lightwave Technology, vol. 27; No. 8; Apr. 15, 2009; 7 pages.
Joe C. Campbell; Recent Advances in Telecommunications Avalanche Photodiodes; Journal of Lightwave Technology, vol. 25, No. 1; Jan. 2007; 13 pages.

* cited by examiner

AVALANCHE PHOTODIODE

TECHNICAL FIELD

The present invention relates to a semiconductor light-sensitive element, and more particularly to a low-dark-current avalanche photodiode having a high reliability for a long time.

BACKGROUND ART

An avalanche photodiode utilized in optical communication is a semiconductor light-emitting element whose light sensitivity is raised by providing a layer for avalanche-multiplying carriers obtained through photoelectric conversion, in addition to a light absorption layer for performing the photoelectric conversion; it is required that the dark current of an avalanche photodiode is low and the reliability thereof is high.

Most of avalanche photodiodes are each formed of a compound semiconductor and depending on the structures, roughly divided into a mesa-structure and a planar-structure avalanche photodiode. In a mesa-structure avalanche photodiode, a mesa is formed on a substrate, and a structure including a p-n junction is provided in the mesa; a breakdown is liable to occur on the surface around the mesa. In general, in order to suppress the breakdown, an inclined structure is employed; moreover, by, for example, employing a structure in which an embedded layer, which is supposed to become a high-resistance portion, is provided around the mesa, a dark current is designed to be suppressed low (e.g., refer to Patent Document 1)

In a planar-structure avalanche photodiode, by providing a selective diffusion region, a p-n junction is formed; an edge breakdown in the edge portion of the p-n junction poses a problem. When a current flows in the edge portion, the reverse voltage across the p-n junction in the light-sensitive unit located in the center of the avalanche photodiode hardly increases, even though the voltage is increased; therefore, the function of an avalanche photodiode cannot be exerted. Accordingly, measures have been taken in which, for example, a high-resistance guard ring is provided in the edge portion through impurity implantation or the like (e.g., refer to Patent Document 2).

[Patent Document 1] Japanese Patent Application Laid-Open No. 2002-324911 (FIG. 1)
[Patent Document 2] Japanese Patent Application Laid-Open No. 1995-312442 (Pages. 4 to 6, FIGS. 4 and 6)

DISCLOSURE OF THE INVENTION

However, with a conventional avalanche photodiode, the following problems have been posed.

In order to provide an embedded layer around the mesa, the inclined-mesa structure requires a process in which, for example, a crystal is regrown partially and regardless of the crystal face, through the metalorganic chemical vapor deposition (MO-CVD) or the like; thus, it has been a problem that the production cost is raised, or the yield rate is low. Additionally, it has been a problem that, even though measures for suppressing a dark current low is taken, the suppression effect cannot sufficiently be demonstrated.

With regard to a planar-structure (set forth as a "pseudo-planar structure" in Patent Document 2) avalanche photodiode, for example, in a method in which a guard ring is formed while compensating the p conductivity type in the electric-field relaxation layer in the vicinity of the light-sensitive region, a trench is required to be formed so as to implant ions such as Ti, whereby an etching stopper layer needs to be provided. An impurity-diffused layer is further provided around the etching stopper layer, whereby the production process becomes complicated; therefore, the production cost is raised and the yield rate is poor. Additionally, it has been a problem that, because the electric-field strength in the guard ring in the light absorption layer is enlarged, the tunnel dark current becomes large.

The present invention has been implemented in order to solve the foregoing problems; the objective of the present invention is to provide an avalanche photodiode which can be produced in a simple process and has reliability ensured for a long time, and in which the dark current is suppressed.

An avalanche photodiode accordion to the present invention is provided with a substrate including a first electrode and a first semiconductor layer, formed of a first conductivity type, which is connected to the first electrode; in the avalanche photodiode, at least an avalanche multiplication layer, a light absorption layer, and a second semiconductor layer having a bandgap that is larger than that of the light absorption layer are layered on the substrate; a second conductivity type conductive region is formed in the second semiconductor layer; and the second conductivity type conductive region is arranged so as to be connected to a second electrode.

According to the present invention, an avalanche photodiode having a small dark current and a high long-term reliability can be provided with a simple process.

DESCRIPTION OF SYMBOLS

1. SUBSTRATE
2. & 19. FIRST SEMICONDUCTOR LAYER
3. STOPPER LAYER
4. AVALANCHE MULTIPLICATION LAYER
5. ELECTRIC-FIELD RELAXATION LAYER
6. LIGHT ABSORPTION LAYER
7. TRANSITION LAYER
8. SECOND SEMICONDUCTOR LAYER
9. CONTACT LAYER
10. SECOND CONDUCTIVITY TYPE CONDUCTIVE REGION
11. DEPLETION REGION
12. PROTECTIVE FILM
13. FIRST ELECTRODE
14. SECOND ELECTRODE
15. INSULATING FILM
23. BRAGG REFLECTION LAYER
24. REFLECTION ADJUSTMENT LAYER
25. SIDE FACE
26. GROOVE
27. CLEAVAGE FACE
28. LIGHT BEAM
29. SEMI-INSULATING FILM
30. STOPPER GROOVE
110. SECOND CONDUCTIVITY TYPE CONDUCTIVE REGION
120. SURFACE PROTECTIVE FILM/ANTIREFLECTION FILM

BEST MODE FOR CARRYING OUT THE INVENTION

Embodiment 1

Figure 1:
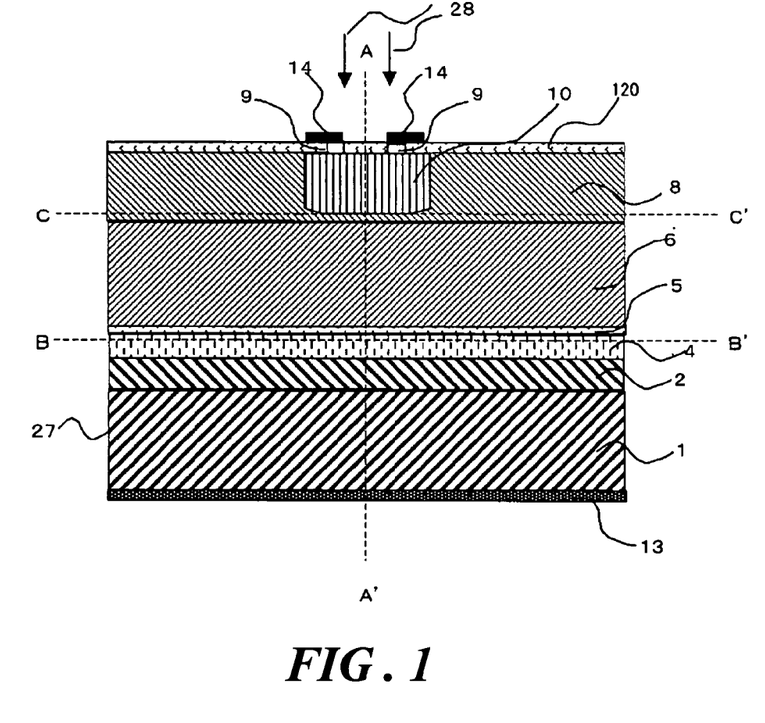
FIG. 1 is a cross-sectional view schematically illustrating a structure of an avalanche photodiode according to Embodiment 1 of the present invention.

FIG. 1 is a cross-sectional view schematically illustrating a structure of an avalanche photodiode according to Embodiment 1 of the present invention. In the avalanche photodiode according to Embodiment 1, the n-type as a first conductivity type, the p-type as a second conductivity type, an n electrode as a first electrode, and a p electrode as a second electrode are utilized. The production of the respective semiconductor layers can be realized on a wafer-like substrate 1 made of an n-type InP or the like, by utilizing the MO-CVD, the molecular beam epitaxial (MBE) growth method, or the like. In Embodiment 1, the respective semiconductor layers were produced in accordance with the following order of steps: On a substrate 1, a first semiconductor layer 2 (hereinafter, referred to as a buffer layer) of an n-type InP having a carrier concentration of $0.2 \times 10^{19}$ $cm^{-3}$ to $2 \times 10^{19}$ $cm^{-3}$ or the like was grown as thick as 0.1 μm to 1 μm; an avalanche multiplication layer 4 of an i-type AlInAs, as thick as 0.15 μm to 0.4 μm; an electric-field relaxation layer 5 of a p-type InP having a carrier concentration of $0.5 \times 10^{18}$ $cm^{-3}$ to $1 \times 10^{18}$ $cm^{-3}$, as thick as 0.03 μm to 0.06 μm; a light absorption layer 6 of a p-type GaInAs having a carrier concentration of $1 \times 10^{15}$ $cm^{-3}$ to $5 \times 10^{15}$ $cm^{-3}$, as thick as 1 μm to 1.5 μm; a second semiconductor layer 8 having a band gap larger than that of the light absorption layer 6 of an i-type InP or the like, as thick as 1 μm to 2 μm; and then, a contact layer 9 of an i-type GaInAs was grown as thick as 0.1 μm to 0.5 μm. In embodiment 1, because the configuration is in such a way that a subject light beam enters through the side opposing the substrate 1 (hereinafter, referred to as surface incidence), the bandgap of the second semiconductor layer 8 is made larger than the energy of the subject light beam. In addition, because it transmits a subject light beam, the semiconductor layer 8 is referred to as a window layer, hereinafter.

Next, by utilizing, as a mask, a SiOx film from which a circle having a diameter of 25 μm to 55 μm has been cut out, a p-type conductive region 10 is formed under the circle portion that is not covered with the mask, through, e.g., the Zn-selective thermal diffusion method. Subsequently, the center portion and the peripheral portion of the i-type GaInAs contact layer 9 on the p-type conductive layer 10 are removed through etching in such a way that the contact layer 9 remains in the form of a ring having a width of 5 μm to μm. Moreover, a SiNx surface protection film/antireflection film 120 is formed through deposition; the SiNx surface protection film/antireflection film 120 on the contact layer 9 is removed; then, a p electrode 14 of an AuZn is formed on the contact layer 9. Still moreover, the other side, of the substrate 1, which opposes the side on which the buffer layer is layered is polished; an n electrode 13 of an AuGe is formed on the substrate 1; then the n electrode 13 and the buffer layer 2 are electrically connected with each other. Furthermore, the wafer-like substrate 1 is cleft into elements each having a size of approximately 300 μm² and a cleavage face 27.

The operation of an avalanche photodiode produced in accordance with the foregoing process will be explained below. With a reverse bias voltage applied from outside in such a way that the n electrode 13 is plus and the p electrode 14 is minus, a light beam 28 is made to enter the avalanche photodiode through the p electrode 14. For example, when a light beam in the 1.3 μm or 1.5 μm waveband, within the near-infrared range, which is the optical-communication waveband is made to enter the inside of the ring of the contact layer 9, the light beam passes through the window layer 8 and is absorbed in the light absorption layer 6, whereupon a pair of an electron and a hole is produced; then, the electron and the hole travel toward the n electrode 13 and the p electrode 14, respectively. When the reverse bias voltage is sufficiently high, an electron is ionized in the avalanche multiplication layer 4 and a new pair of an electron and a hole is produced; the newly produced electron and hole further cause the ionization, which is repeated; thus, avalanche multiplication, in which an electron and a hole are multiplied in an avalanche manner, is caused.

Figure 2:
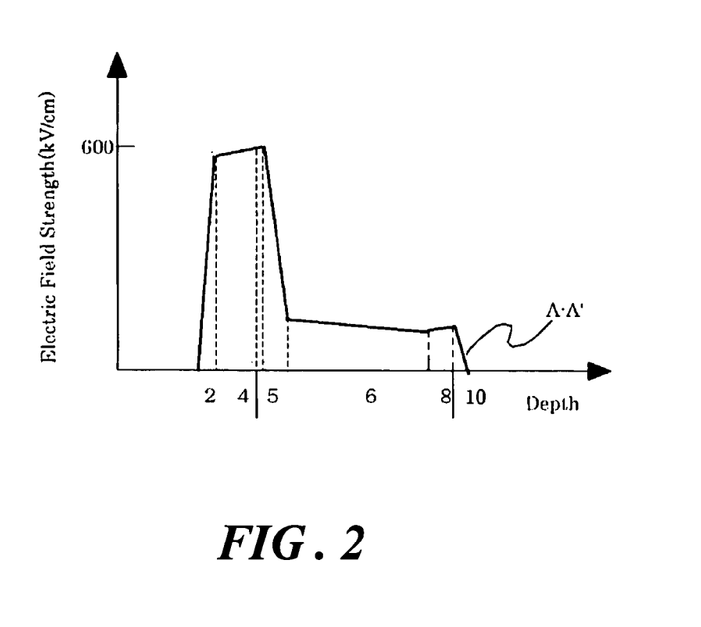
FIG. 2 is a characteristic graph representing the distribution of the electric-field strength, in the depth direction, in the cross section taken along the line A-A' in FIG. 1.
Figure 3:
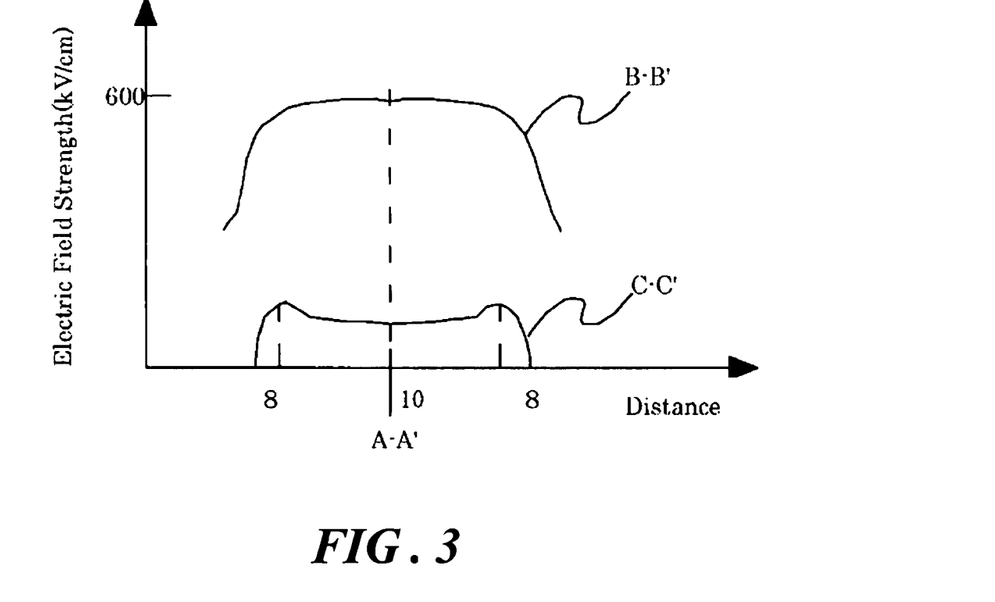
FIG. 3 is a characteristic graph representing the respective distributions of the electric-field strength, in the plane direction, in the cross sections taken along the line B-B' and C-C' in FIG. 1 in Embodiment 1.

Next, the electric-field strength in the avalanche photodiode, in FIG. 1, according to Embodiment 1 will be explained. FIG. 2 is a characteristic graph representing the distribution of the electric-field strength, in the depth direction, in the cross section taken along the line A-A' in FIG. 1; FIG. 3 is a characteristic graph representing the respective distributions of the electric-field strength, in the plane direction, in the cross sections taken along the line B-B' and C-C' in FIG. 1. The numerals along the abscissa in each of FIGS. 2 and 3 denote the respective semiconductor layers formed as described above; in the figures, the cross sections taken along the lines A-A', B-B', and C-C' are indicated as A-A', B-B', and C-C', respectively. As represented in FIG. 2, the electric-field strength is maximal in the avalanche multiplication layer 4. Furthermore, as represented by the distribution of the electric-field in the cross section B-B' in FIG. 3, in the avalanche multiplication layer 4, the electric-field strength is maximal in the middle portion of the light-sensitive region immediately below the p-type conductive region 10, and the more apart from the middle the position is, the smaller the electric-field strength becomes. Additionally, as represented by the distribution of the electric-field strength in the cross section C-C' in FIG. 3, the electric-field strength in the peripheral portion of the p-type conductive region 10 is higher than that in the middle portion thereof, due to the finite curvature of the diffusion region; however, because, compared with the distribution of the electric-field strength in the cross section B-B' in FIG. 2, the electric-field strength in the peripheral portion of the p-type conductive region 10 is lower than that in the avalanche multiplication layer 4, the current in the peripheral portion, known as an edge breakdown can be suppressed; therefore, the avalanche photodiode can function.

Additionally, the peripheral portion, of the diffusion region, where the electric-field strength is topically high, i.e., the peripheral portion, of the p-type conductive region 10, which corresponds to the portion at which, in the cross section C-C' in FIG. 3, the electric-field strength is raised is formed in the window layer 8 having a bandgap larger than that of the light absorption layer 6; therefore, it is made possible to prevent a tunnel dark current from flowing from the portion of high electric-field strength. Therefore, it is not necessary to provide in the avalanche photodiode according to Embodiment 1 a structure, referred to as a guard ring, for suppressing the edge breakdown; thus, a low-dark-current and high-reliability avalanche photodiode can simply be realized.

In addition, in Embodiment 1, an example in which the p-type conductive region 10 is formed through a selective thermal diffusion method utilizing Zn, has been explained; however, an arbitrary atom may be utilized as long as the atom gives the p conductivity type. As another formation method, for example, a method may be utilized in which, with a SiOx film, from which a circle has been cut out, utilized as a mask, a p-type conductive region is formed through Zn-selective thermal diffusion method, the Zn film, which is a supply source for diffusion, and the SiOx film are removed, and then the thermal diffusion processing is performed again so as to diffuse the Zn in the p-type conductive region (hereinafter, referred to as Zn extra diffusion). Additionally, the p-type conductive region 10 can also be formed, e.g., through a method in which, with a photoresist film, from which a circle has been cut out, utilized as a mask, Be is ion-implanted; the photoresist film is removed; then, annealing processing is performed at a temperature of approximately 700° C. for about 12 hours (hereinafter, referred to as Be implantation).

Figure 4:
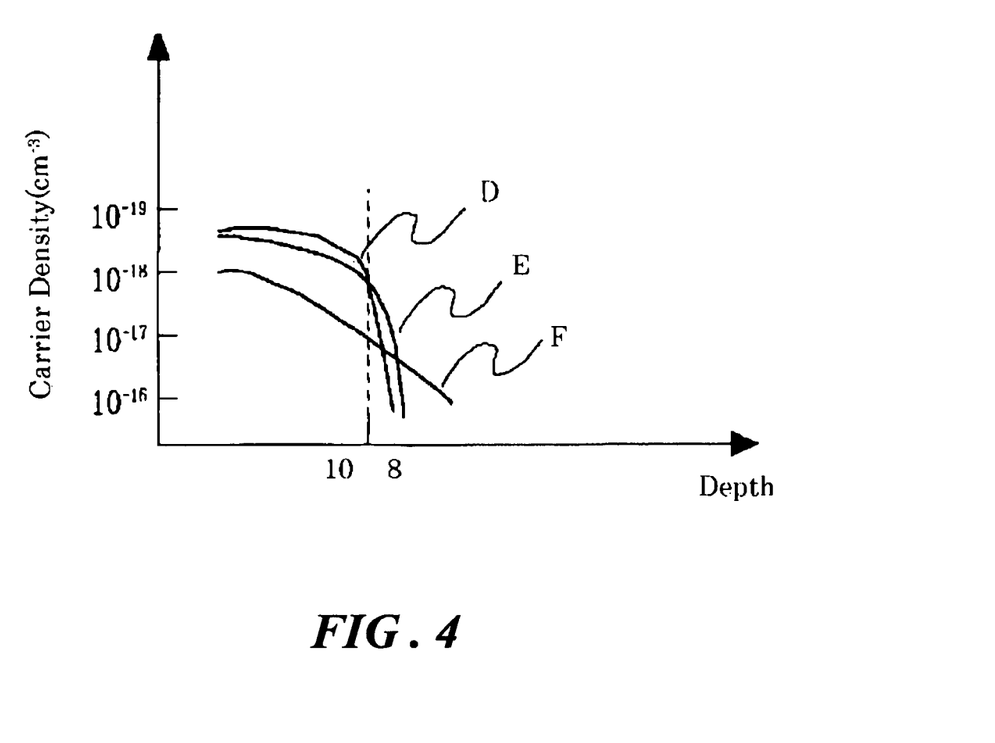
FIG. 4 is a characteristic graph representing the differences in the respective carrier concentrations, in the depth direction, according to Embodiment 1 of the present invention.

FIG. 4 is a characteristic graph representing the differences in the respective carrier concentrations in the depth direction (in the junction portion between the conductive region 10 and the window layer 8) in the case where, as the formation method for the p-type conductive region 10, the Zn-selective thermal diffusion method (curve D in FIG. 4), the Zn extra diffusion method (curve E in FIG. 4), and the Be implantation method (curve F in FIG. 4) are utilized (the numerals along the abscissa correspond to the respective layers). Accordingly, in the case where the Zn extra diffusion method is utilized, it is possible to make the carrier concentration vary gently, compared with the Zn-selective thermal diffusion method in which the carrier concentration vary drastically; thus, the electric-field strength in the junction portion between the conductive region 10 and the p-type window layer 8 can be suppressed low, whereby the tunnel dark current can be suppressed. In the case of the Be implantation method, it is possible to make the carrier concentration vary more gently.

In addition, in Embodiment 1, an example in which the electric-field relaxation layer 5 is of a p-type InP has been explained; however, an AlInAs may also be utilized. Depending on the situation, the electric-field relaxation layer 5 may be omitted. Additionally, an example in which the contact layer 9 is provided so that the p-type conductive region 10 and the p electrode 14 are electrically connected has been explained; however, the p-type conductive region 10 and the p electrode 14 may directly be in contact with each other. An example in which an i-type InP is utilized as the window layer 8 has been explained; however, the conductivity type may be any one of a semi-insulating type, an insulating type, an n type, and a low-conductive p type. By providing a stopper layer 3, including a GaInAsP, an AlInAs, an AlGaInAs, a GaInAsP, or the like, between the window layer 8 and the light absorption layer 6, it is made possible to prevent the p-type conductive region from diffusing from the p-type conductive region 10 into the light absorption layer 6.

Embodiment 2

In an avalanche photodiode according to Embodiment 2 of the present invention, in addition to the avalanche photodiode described in Embodiment 1, a transition layer 7 is provided between the light absorption layer 6 and the window layer 8. As the formation method for the transition layer 7, following to the step, in embodiment 1, in which the light absorption layer 6 is grown, for example, by growing an i-type GaInAsP to 0.01 μm to 0.05 μm in thickness, the transition layer 7 is formed.

Figure 5:
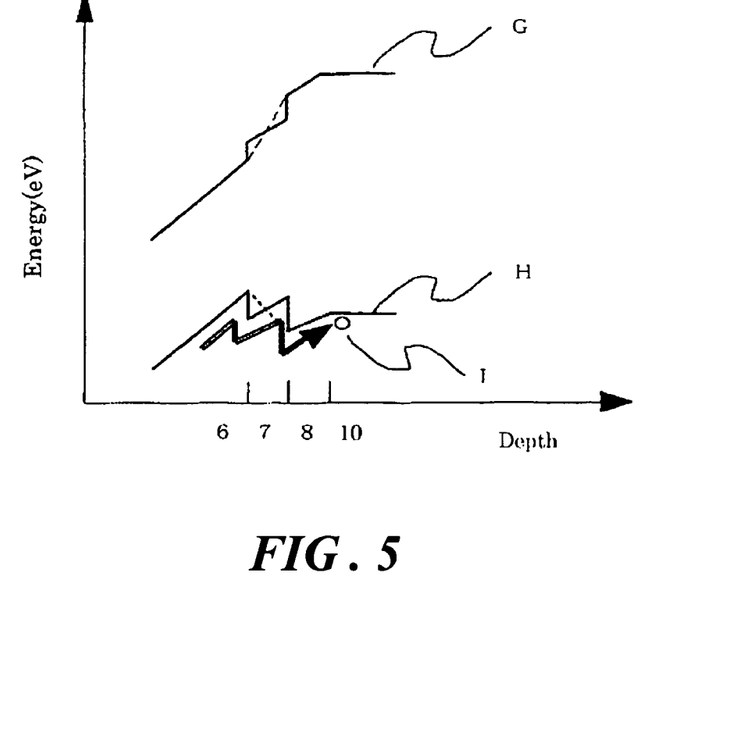
FIG. 5 is a graph representing the respective energy distributions, in the layer-junction portions, in a conductive band and a valence band in an avalanche photodiode according to Embodiment 2 of the present invention.

FIG. 5 is a graph representing the respective energy distributions, in the layer-junction portions, in a conductive band and a valence band in an avalanche photodiode according to Embodiment 2. The numerals along the abscissa and the ordinate denote the respective layered semiconductor layers and the energy, respectively; in FIG. 5, the character G, the character H, and the character I indicate the energy in the conductive band, the valence band, and the hole, respectively. It can be seen from FIG. 5 that the value of the valence-band energy in the transition layer 7 is a value smaller than that in the light absorption layer 6 and larger than that in the window layer 8, i.e., a value between the respective energy values in the light absorption layer 6 and the window layer 8. The foregoing fact suggests that, by inserting the transition layer 7 between the light absorption layer 6 and the window layer 8, the amount of discontinuity in the valence band is diminished, whereby holes are enabled to readily flow from the light absorption layer 6. Therefore, it is made possible to prevent the holes from being piled up at the heterointerface, whereby a higher-speed optical response can be realized.

In addition, the transition layer 7 has been one-layer; however, a laminate layer, consisting of a plurality of sub-layers, in which the bandgap is stepwise changed may be utilized. By utilizing a laminate layer, the amount of discontinuity in the valence band is further diminished, whereby the holes are enabled to readily flow; thus, a higher-speed optical response can be realized. In addition, as indicated by a broken line in FIG. 5, a layer in which the bandgap varies continuously may be utilized.

In Embodiment 2, an example in which an i-type GaInAsP is utilized as the transition layer 7 has been explained; however, an AlInAs, an AlGaInAs, or a GaInAsP may be utilized. In particular, in the case where, as the window layer 8, an InP is utilized, the window layer 8 functions as a diffusion stopper in the second conductivity type region.

Embodiment 3

Figure 6:
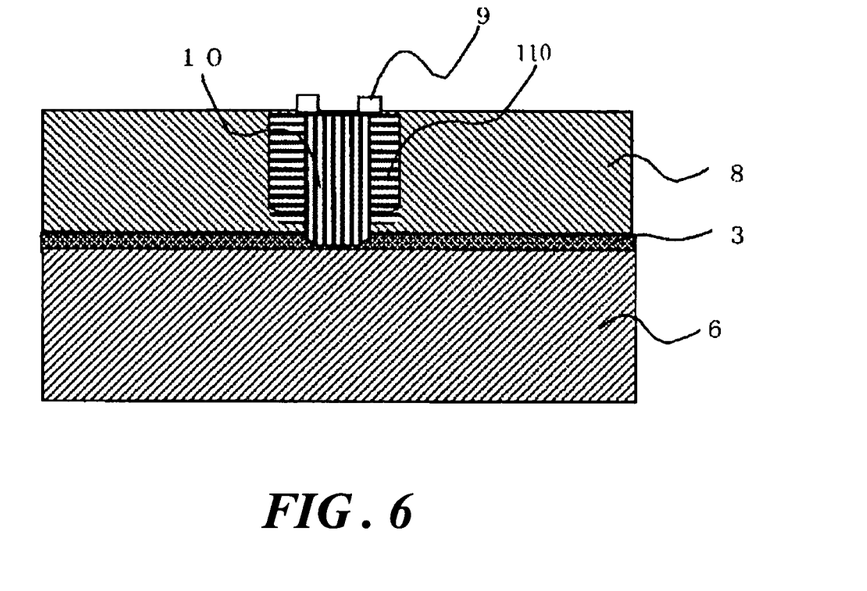
FIG. 6 is a cross-sectional view schematically illustrating a structure of an avalanche photodiode according to Embodiment 3 of the present invention.
Figure 7:
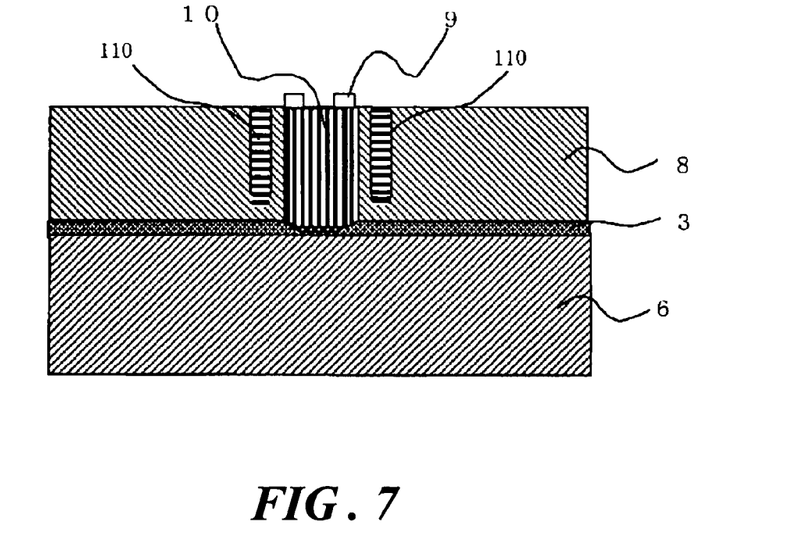
FIG. 7 is a cross-sectional view schematically illustrating a structure of an avalanche photodiode according to Embodiment 3 of the present invention.

In an avalanche photodiode according to Embodiment 3 of the present invention, in addition to the avalanche photodiode described in Embodiments 1 and 2, a p-type peripheral conductive region 110 is provided around the p-type conductive region 10. FIGS. 6 and 7 are cross-sectional views each schematically illustrating a structure of an avalanche photodiode according to Embodiment 3 of the present invention. Reference numeral 6 denotes a light absorption layer; reference numeral 3 denotes a stopper layer which transits holes and stops the diffusion of holes. Reference Numerals 8 and 9 denote a window layer and a contact layer, respectively.

In an avalanche photodiode illustrated in FIG. 6, the p-type conductive region 110 is formed through shallow selective thermal diffusion performed in a wide area extending beyond the circumference of the contact layer 9, in such an extent as not to reach the transition layer 7, and then deep selective thermal diffusion is performed in an area narrower than that of the p-type peripheral conductive region 110, in such an extent as to reach the transition layer 7, so that a p-type conductive region 10 is formed. The p-type conductive region 10 receives the selective thermal diffusion twice. As described above, the resistance in the p-type conductive region 10 can sufficiently be raised and the p-type peripheral conductive region 110 surrounds the p-type conductive region 10, so that the surface electric-field strength can be reduced. Accordingly, the breakdown can further be suppressed, whereby the reliability can be enhanced.

Additionally, in an avalanche photodiode illustrated in FIG. 7, a p-type peripheral conductive region 110 is circularly formed in such a way as to surround the p-type conductive region 10 formed under the contact layer 9. Also in the case where the p-type conductive region 10 and the p-type peripheral conductive region 110 are formed in the foregoing manner, the surface electric-field strength can be reduced, thereby enabling the breakdown to be suppressed.

Embodiment 4

Figure 8:
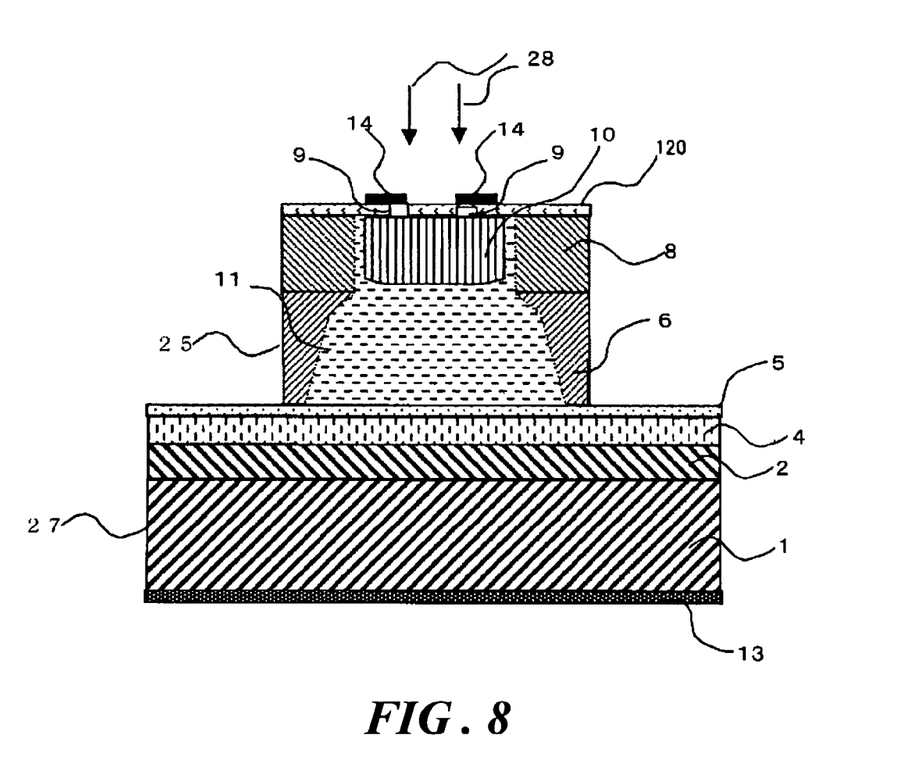
FIG. 8 is a cross-sectional view schematically illustrating a structure of an avalanche photodiode according to Embodiment 4 of the present invention.

FIG. 8 is a cross-sectional view schematically illustrating a structure of an avalanche photodiode according to Embodiment 4 of the present invention; in order to explain a phenomenon, an imaginary depletion region 11 is illustrated. In Embodiment 4, in the avalanche photodiode described in Embodiment 1, the p-type conductive region 10 is included, and the peripheral region of the p-type conductive region 10 is maintained as a circular-contour region having a diameter of approximately 100 µm, and then the window layer 8 and the light absorption layer 6 surrounding the p-type conductive region 10 are removed in such a way that the removal reaches the electric-field relaxation layer 5, so that a side face 25 is formed (hereinafter, referred to as side removal).

Figure 9:
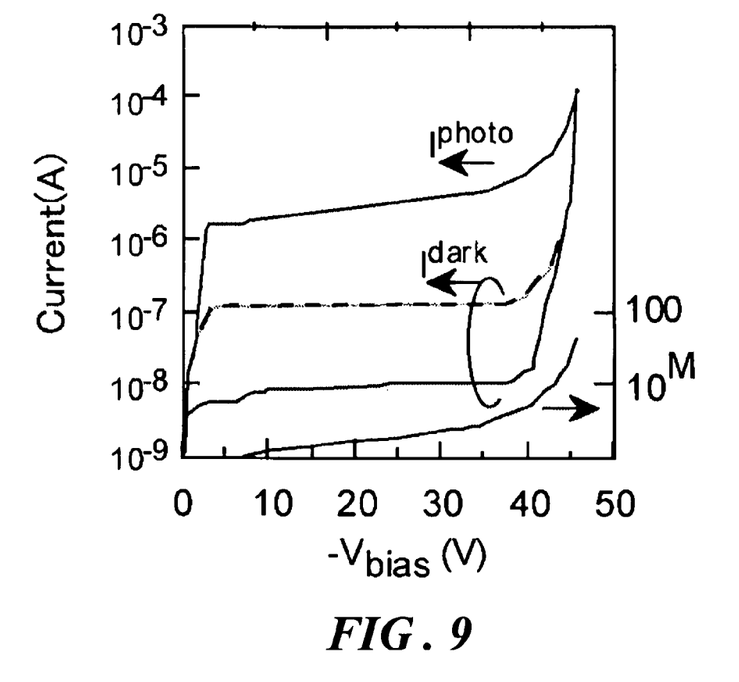
FIG. 9 is a characteristic graph representing the relationship between the current and the reverse bias voltage and the relationship between the multiplication factor M and the reverse bias voltage, with regard to an avalanche photodiode according to Embodiment 4 of the present invention.

FIG. 9 is a characteristic graph representing the relationship between the current and the reverse bias voltage and the relationship between the multiplication factor M and the reverse bias voltage, with regard to the side-removed avalanche photodiode. In FIG. 9, the broken line represents the dark current characteristic of an avalanche photodiode, according to Embodiment 1, which has been element-separated through simple cleavage, instead of the side removal. The dark current ($I^{dark}$ in FIG. 9), which does not depend on a reverse bias voltage, is a dark current that originates in the light absorption layer 6; with a structure obtained through the simple cleavage, the dark current originated in the light absorption layer 6 flows via the cleavage face, whereby the dark current becomes on the order of $10^{-7}$ A (the broken line $I^{dark}$ in FIG. 9). In contrast, it can be seen that, in the avalanche photodiode according to Embodiment 4, the path for the dark current originated in the light absorption layer 6 can be cut off, whereby the dark current can be reduced to be on the order of $10^{-8}$ A (the solid line $I^{dark}$ in FIG. 9).

As described above, the dark current originates in the light absorption layer 6 and flows via the depletion region 11; therefore, at least the portion, of the light absorption layer 6, which surrounds the depletion layer 11 may be removed. In consideration of the spread of the depletion region 11, the side removal may be applied to the light absorption layer 6, e.g., in such a way that the light absorption layer 6 maintains a width of 10 µm or longer around the second conductivity type region.

When the width of the light absorption layer 6 to be left after the side removal is diminished, the electric-field strength in the side to which the side removal has been applied is raised, whereby the long-term reliability is deteriorated; therefore, it is desirable that the width of the light absorption layer 6 to be left is approximately 10 µm to 200 µm. In addition, the shape of the light absorption layer 6 to be left after the side removal is not limited in particular; the light absorption layer 6 may be left in a circular, an ellipsoidal, a quadrangular, or a polygonal form. In the case where the light absorption layer 6 is left in a quadrangular, or a polygonal form, it is desirable to round the corner portions of the light absorption layer 6 so as to prevent electric fields from converging into the corner portions.

The methods for the side removal includes, e.g., etching by use of a mixed solution of an HBr solution and a hydrogen peroxide solution. Additionally, organic-acid etching by use of a mixed solution of an organic acid, such as a citric acid or a tartaric acid, and a hydrogen peroxide solution may be utilized. Dry etching such as reactive ion etching (RIE) may also be utilized. In the case where an InP-system material is selectively etched, a hydrochloric-acid-system solution such as a mixed solution of a hydrochloric acid and a phosphoric acid can be utilized. In the case where an AlGaInAs-system material or a GaInAsP-system material is selectively etched, an organic-acid-system solution, such as a mixed solution of an organic acid (such as a citric acid or a tartaric acid) and a hydrogen peroxide solution, or a sulfuric-acid-system solution can be utilized. By utilizing a solution obtained by appropriately combining the foregoing selective-etching solution and a Br-system solution, such as a HBr-hydrogen peroxide solution or a Br-methanol solution, which is less selective-etching, a desirable side removal can be achieved.

In addition, in Embodiment 4, an example in which the side removal reaches the electric-field relaxation layer 5 has been explained; however, the side removal may be performed up to a layer situated deeper than the avalanche multiplication layer 4 is.

In Embodiment 4, an example in which the window layer 8 and the light absorption layer 6 are adhered to each other has been explained; however, as described in Embodiment 2 or Embodiment 3, the transition layer 7 or the stopper layer 3 may be provided between the window layer 8 and the light absorption layer 6.

In Embodiment 4, an example in which the conductive region 10 is formed has been explained; as explained in Embodiment 3, the peripheral conductive region 110 may further be formed.

Embodiment 5

Figure 10:
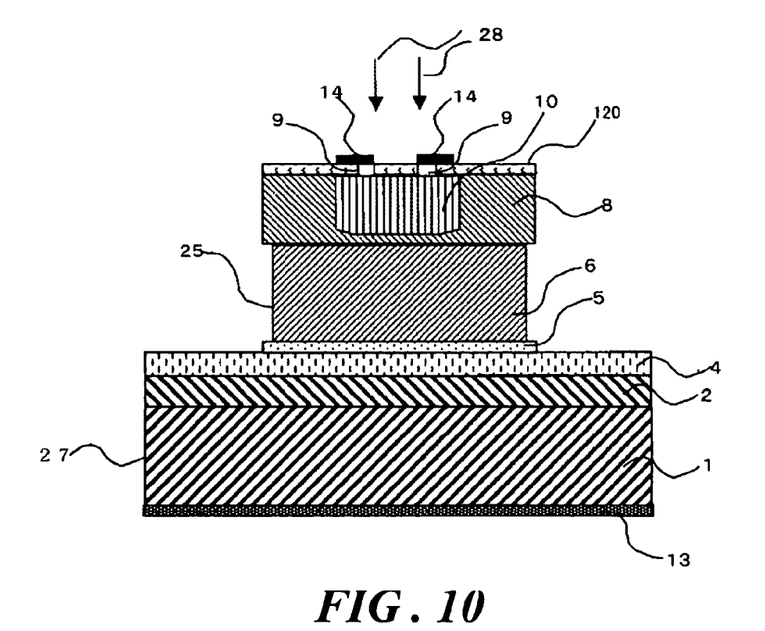
FIG. 10 is a cross-sectional view schematically illustrating a structure of an avalanche photodiode according to Embodiment 5 of the present invention.

FIG. 10 is a cross-sectional view schematically illustrating a structure of an avalanche photodiode according to Embodiment 5 of the present invention. In Embodiments 5, in the avalanche photodiode described in Embodiment 4, the side face is formed in such a way that the width of the light absorption layer 6 is smaller than that of the window layer 8 or the electric-field relaxation layer 5. For example, by utilizing a mixed solution of an organic acid and a hydrogen peroxide solution, the light absorption layer 6 can be etched selectively and deeply. By providing a width difference between the light absorption layer 6 and the electric-field relaxation layer 5, the dark current cannot readily flow; thus, the dark current could be reduced to be on the order of $10^{-8}$ A.

In addition, in the case where the electric-field relaxation layer 5 is not especially required to be provided, the electric-field relaxation layer 5 is omitted, and a width difference may be provided between the avalanche multiplication layer 4 and the light absorption layer 6.

Embodiment 6

Figure 11:
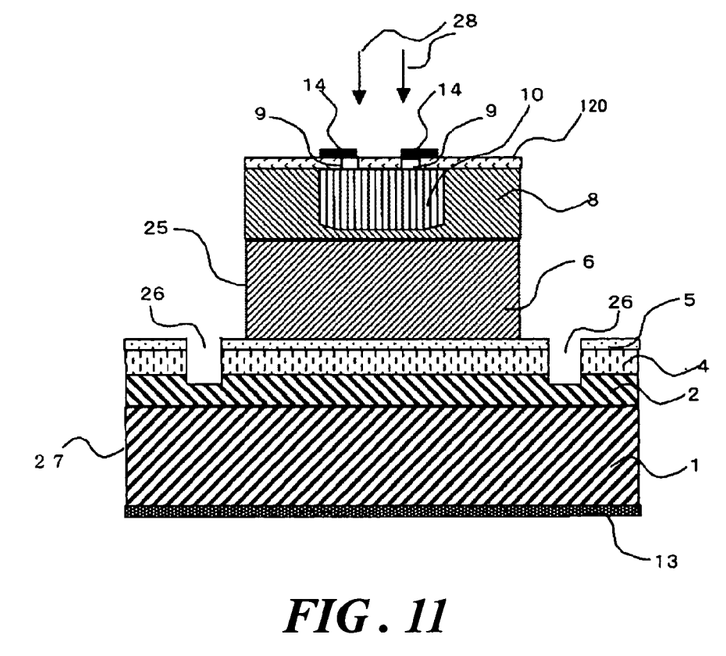
FIG. 11 is a cross-sectional view schematically illustrating a structure of an avalanche photodiode according to Embodiment 6 of the present invention.

FIG. 11 is a cross-sectional view schematically illustrating a structure of an avalanche photodiode according to Embodiment 6 of the present invention. In Embodiments 6, in the avalanche photodiode described in Embodiment 4, after the side removal is applied to the window layer 8 by use of a hydrochloric acid-phosphoric acid solution and the side removal is applied to the light absorption layer 6 by use of an organic acid-hydrogen peroxide solution, the electric-field relaxation layer 5, the avalanche multiplication layer 4, and the buffer layer 2 are partially removed at the position that is approximately 10 μm apart from the side face 25 of the light absorption layer 8, by use of a mixed solution of a HBr solution and a hydrogen peroxide solution, so that a groove 26 is formed. As described above, by applying the side removal to the light absorption layer 6 and then providing the groove 26, the dark current cannot readily flow; thus, the dark current could be reduced to be on the order of $10^{-8}$ A.

In addition, a case in which the distance between the side face 25 and the groove 26 is 10 μm has been explained; however, the distance may be 10 μm or longer.

The groove 26 has been formed by partially removing the electric-field relaxation layer 5, the avalanche multiplication layer 4, and the buffer layer 2; however, it is only necessary that at least the electric-field relaxation layer 5 is removed. In the case where the electric-field relaxation layer 5 is not provided, it is only necessary that at least the topmost layer is removed.

Embodiment 7

Figure 12:
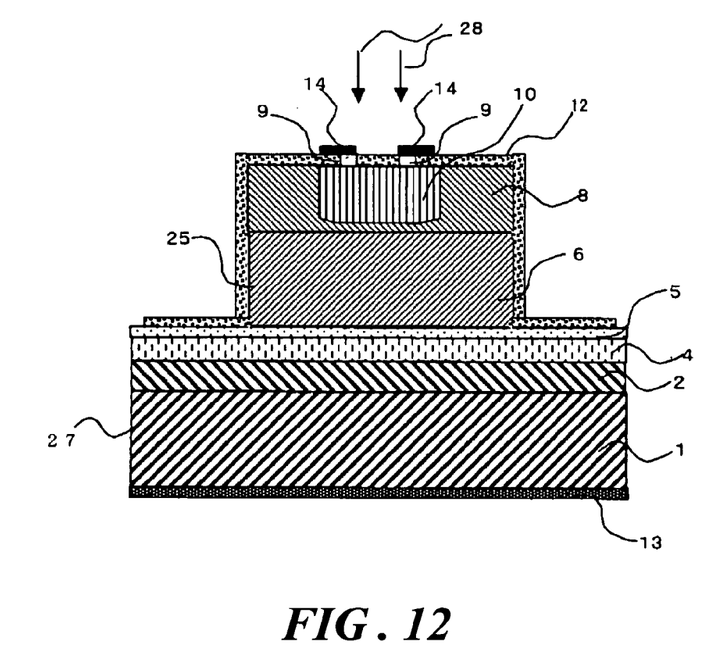
FIG. 12 is a cross-sectional view schematically illustrating a structure of an avalanche photodiode according to Embodiment 7 of the present invention.

FIG. 12 is a cross-sectional view schematically illustrating a structure of an avalanche photodiode according to Embodiment 7 of the present invention. In Embodiments 7, in each of the avalanche photodiodes described in Embodiments 4 to 6, a protection film 12 is formed of a SiNx in such a way as to cover at least the side face 25 of the light absorption layer 6 to which the side removal has been applied.

By providing the protection film 12, oxidization and water absorption can be prevented; thus, the occurrence of the dark current can be suppressed, whereby long-term reliability can be obtained. Moreover, an effect can be demonstrated in which breakage, during handling of devices, due to contact between the devices can be prevented.

It is preferable that, as the protection film 12, a SiNx is utilized so that the protection film can demonstrate an effect of preventing reflection. In view of protection, a dielectric such as a SiOx or an organic material such as a polyimide may be utilized.

FIG. 12 in Embodiment 7 illustrates an example in which the protection film 12 is provided not only on the side face 25 of the light absorption layer 6 but also on the top side and the side faces of the other layers; however, as long as at least the side face 25 of the light absorption layer 6 to which the side removal has been applied is covered, the protection film 12 may partially be provided only on the portions where the protection film 12 is required.

Embodiment 8

Figure 13:
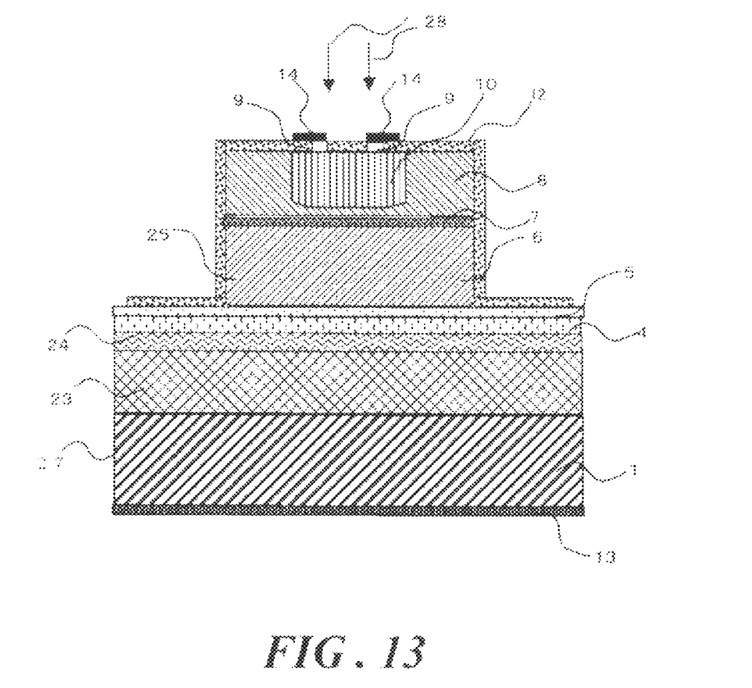
FIG. 13 is a cross-sectional view schematically illustrating a structure of an avalanche photodiode according to Embodiment 8 of the present invention.

FIG. 13 is a cross-sectional view schematically illustrating a structure of an avalanche photodiode according to Embodiment 8 of the present invention. As is the case with Embodiment 1, on an n-type InP substrate 1, a distribution Bragg reflection layer 23 of an n-type AlInAs/GaInAs having a carrier concentration of $2\times10^{18}$ cm$^{-3}$ to $2\times10^{19}$ cm$^{-3}$ was grown as thick as a predetermined thickness; a reflection adjustment layer 24 of an n-type AlInAs, as thick as a predetermined thickness; an avalanche multiplication layer 4 of an i-type AlInAs, as thick as 0.1 μm to 0.3 μm; an electric-field relaxation layer 5 of a p-type InP having a carrier concentration of $1\times10^{17}$ cm$^{-3}$ to $2\times10^{18}$ cm$^{-3}$, as thick as 0.03 μm to 0.06 μm; a light absorption layer 6 of a p-type GaInAs having a carrier concentration of $1\times10^{15}$ cm$^{-3}$ to $5\times10^{15}$ cm$^{-3}$, as thick as 1.0 μm to 1.5 μm; a transition layer 7 of an i-type GaInAs, as thick as 0.02 μm to 0.2 μm; a window layer 8 of an i-type InP, as thick as 1.0 μm to 2.0 μm; and then a contact layer 9 of an i-type GaInAs was grown as thick as 0.1 μm to 0.4 μm.

In this case, it is assumed that the predetermined thickness of the distribution Bragg reflection layer 23 is given by one of odd multiples of $\lambda/(4n)$, where $\lambda$ is the wavelength of light to be detected and n is the refraction index, and satisfies the Bragg reflection conditions. It is preferable to make the thickness of the distribution Bragg reflection layer 23 λ/(4n), i.e., the minimal value.

Letting $t_r$, $n_r$, $t_a$, $n_a$, $t_e$, and $n_e$ denote the predetermined thickness of the reflection adjustment layer 24, the refraction index of the reflection adjustment layer 24, the thickness of the avalanche multiplication layer 4, the refraction index of the avalanche multiplication layer 4, the thickness of the electric-field relaxation layer 5, and the refraction index of the electric-field relaxation layer 5, the thickness of the reflection adjustment layer 24 satisfies the following equation:

$$t_r = 1/(4 \times n_r)(k \times \lambda - 4 \times (t_a \times n_a + t_e \times n_e)) > 0$$

where k is an odd number. It is preferable to utilize the minimal value.

As is the case with Embodiment 1, a p-type conductive region 10 and a contact layer 9 are formed; as is the case with Embodiment 4, the side removal is performed; and as is the case with Embodiment 7, a protection film 12 is formed of a SiNx, on the top side and the side face.

In the avalanche photodiode described in Embodiment 8, when, with a reverse bias voltage applied from outside in such a way that the n electrode 13 is plus and the p electrode 14 is minus, a light beam 28 is made to enter the avalanche photodiode through the p electrode 14, the light beam 28 is absorbed in the light absorption layer 6, whereupon a pair of an electron and a hole is produced. Except for part, of the light beam 28, which is not absorbed in the light absorption layer 6 but is transmitted through the light absorption layer 6, the light beam 28 is effectively reflected by the reflection adjustment layer 24 and the distribution Bragg reflection layer 23 that each have the predetermined thickness, and enters the light absorption layer 6 again and is absorbed therein. The light beam further produces a pair of an electron and a hole; in the region, of the light absorption layer 6, which is depleted by the reverse bias voltage, an electron caused by an electric field drifts toward the plus potential; and a hole, toward the minus potential. The hole that has reached the transition layer 7 smoothly reaches the p-type conductive region 10 because the amounts of valence-band discontinuity between the foregoing layers are suppressed. Thus, a higher-speed optical response is made possible.

In particular, in the case where the reverse bias voltage is sufficiently high, the electron that has reached the avalanche multiplication layer 4 is ionized, thereby producing a pair of an electron and a hole; the produced electron and hole drift toward opposite directions. By being further ionized, the electron and the hole can be multiplied in an avalanche manner.

The distribution of the electric-field strength in the avalanche photodiode according to Embodiment 8, as is the case with FIG. 2 illustrated in description for Embodiment 1, becomes maximal in the avalanche multiplication layer 4 so as to cause avalanche multiplication and varies in the electric-field relaxation layer 5, so that it is made possible to prevent the tunnel breakdown from occurring in the light absorption layer 6. Moreover, as is the case with FIG. 3, the distribution of the electric-field strength that is in parallel with the layers (in the plane direction) is maximal, immediately below the p-type conductive region 10, in the avalanche multiplication layer 4, so that it is made possible to prevent the edge breakdown from occurring. Additionally, because the transition layer 7 is provided, the breakdown is further less likely to be caused. Additionally, because the side removal is applied to the light absorption layer 6, the path for the dark current is cut off, whereby the ascent of the electric-field strength in the transition layer 7 can be suppressed more than in the example in Embodiment 2.

Figure 14:
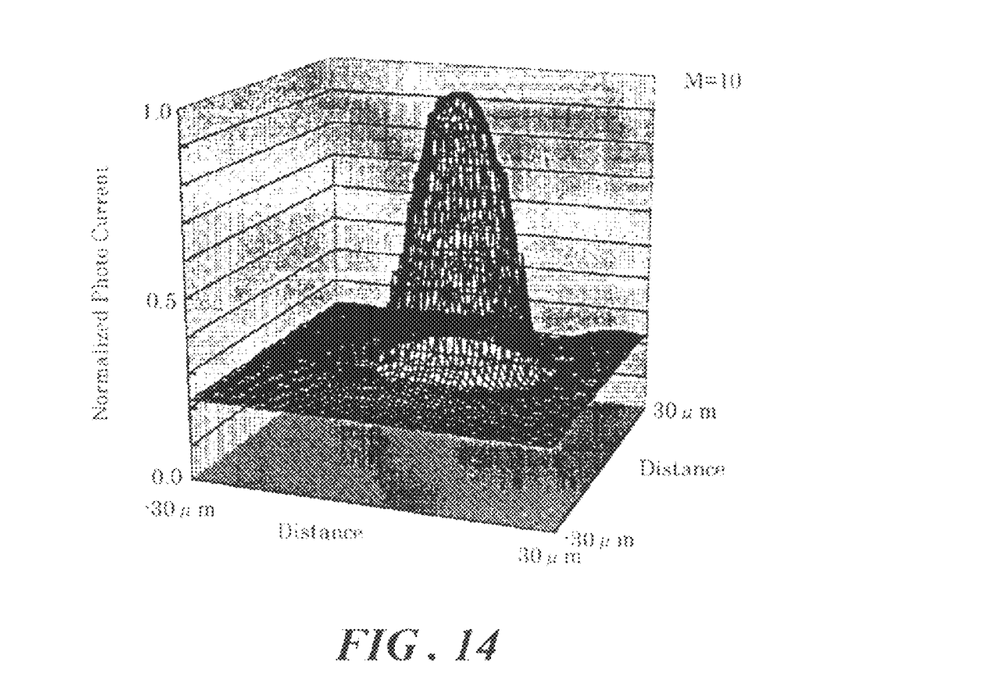
FIG. 14 is a characteristic graph representing the distribution of the light sensitivity of an avalanche photodiode according to Embodiment 8 of the present invention.

FIG. 14 a characteristic graph representing the distribution of light sensitivity according to Embodiment 8; the ordinate denotes the normalized photoelectric current with assumption that the peak current is one. It can be seen from FIG. 14 that the light sensitivity is maximal in the middle portion of the p-type conductive region 10, whereby excellent avalanche multiplication without any edge breakdown can be obtained.

In Embodiment 8, because the distribution Bragg reflection layer 23 and the reflection adjustment layer 24 are provided, the light that has not been absorbed but transmitted can be reflected toward the light absorption layer 6, whereby the amount of light absorption in the light absorption layer 6 can be enhanced. Accordingly, the light sensitivity of the avalanche photodiode can be raised.

In addition, in Embodiment 8, an example in which the distribution Bragg reflection layer 23 is of an AlInAs/GaInAs has been explained; however, each of high-refraction-index layers and each of low-refraction-index layers may alternately be laid on top of one another. As the high-refraction-index layer, a GaInAs, a GaInAsP including a high composition ratio of As, an AlGaInAs including a high composition ratio of Ga, or the like can be utilized. As the low-refraction-index layer, an AlGaInAs including a high composition ratio of Al, especially an AlInAs, a GaInAsP including a high composition ratio of P, or an InP can be utilized.

In addition, in Embodiment 8, an example in which an AlInAs having a low refraction index is utilized as the reflection adjustment layer 24 has been explained; however, an InP, an AlGaInAs, or a GaInAs may be utilized.

The respective n-type-carrier concentrations in the distribution Bragg reflection layer 23 and the reflection adjustment layer 24 may differ from each other within the extent that the respective resistances pose no problem in terms of operation speed, and the larger the concentration is, the better the performance of the avalanche photodiode is.

Additionally, in Embodiment 8, an example in which the Bragg reflection layer 23 and the reflection adjustment layer 24 are provided between the substrate 1 and the avalanche multiplication layer 4 has been explained; however, it is only necessary that the Bragg reflection layer 23 and the reflection adjustment layer 24 each having a predetermined thickness are provided at the light-exiting side of the light absorption layer 6. Another layer may be inserted between the light absorption layer 6 and the Bragg reflection layer 23. In this case, the predetermined thickness of the Bragg reflection layer 23 is given by one of odd multiples of a numerical value represented by λ/(4n), where λ is the wavelength of light to be detected and n is the refraction index of the Bragg reflection layer 23, and the predetermined thickness $t_r$ of the reflection adjustment layer 24 may be a numerical value that satisfies the following equation, where $n_r$ is the refraction index of the reflection adjustment layer 24, $t_n$ and $n_n$ are the thickness and the refraction index, respectively, of a layer that is inserted between the light absorption layer 6 and the Bragg reflection layer 23, and k is an odd number:

$$t_r = 1/(4 \times n_r)(k \times \lambda - 4 \times \Sigma(t_n \times n_n)) > 0$$

In addition, in Embodiment 8, an example in which the side removal reaches the electric-field relaxation layer 5 has been explained; however, the electric-field relaxation layer 5 may be omitted, as may be necessary, or the side removal may reach the reflection adjustment layer 24. By performing the side removal in such a way as to reach the reflection adjustment layer 24, the exposure of the depletion region 11 can be prevented, whereby the reliability is further enhanced.

Embodiment 9

Figure 15:
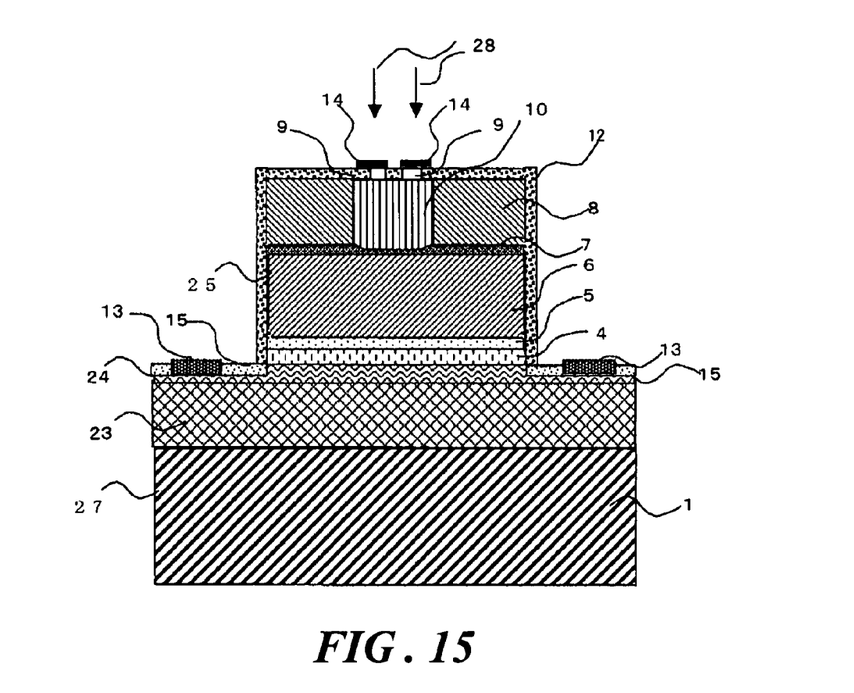
FIG. 15 is a cross-sectional view schematically illustrating a structure of an avalanche photodiode according to Embodiment 9 of the present invention.

FIG. 15 is a cross-sectional view schematically illustrating a structure of an avalanche photodiode according to Embodiment 9 of the present invention. In Embodiment 9, in the avalanche photodiode described in Embodiments 4 and 9, an insulating film 15 is provided on the peripheral portion after the side removal has been performed, and then part of the insulating film 15 is removed so as to form an n electrode 13. In the avalanche photodiode according to Embodiment 9, the n electrode 13 and the p electrode 14 can be arranged on the element; thus, wire bonding can be applied both to the n electrode 13 and the p electrode 14. Moreover, by forming a bump electrode, as the n electrode 13, of an AuZn, flip-chip mounting is made possible. Still moreover, the n electrode 13 and the p electrode 14 can concurrently be formed with the same material.

In addition, the insulating film 15 in Embodiment 9 may be replaced by the protection film 12. Additionally, in Embodiment 9, an example in which the n electrode 13 is formed on the reflection adjustment layer 24 has been explained; however, by arranging the n electrode 13 on either one, of the reflection adjustment layer 24 and the Bragg reflection layer 23, whose bandgap is smaller than that of the other, the contact resistance can be reduced. As the material to be brought to contact with the n electrode 13, a GaInAs is preferable.

In addition, in Embodiment 9, an example in which the side removal reaches the electric-field relaxation layer 24 has been explained; however, the side removal may be up to the light absorption layer 6, the electric-field relaxation layer 5, or the avalanche multiplication layer 4. Additionally, the transition layer 7 and the electric-field relaxation layer 5 may be omitted. The reflection adjustment layer 24 and the distribution Bragg reflection layer 23 may be omitted. The p-type peripheral conductive region 110 described in Embodiment 3 may be provided.

Figure 16:
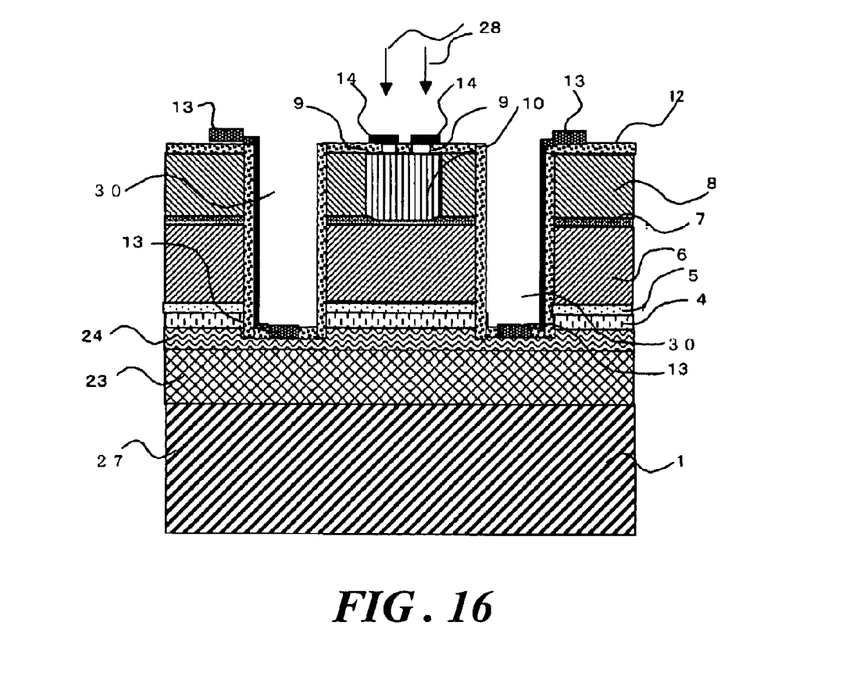
FIG. 16 is a cross-sectional view schematically illustrating a structure of an avalanche photodiode according to Embodiment 9 of the present invention.
Figure 17:
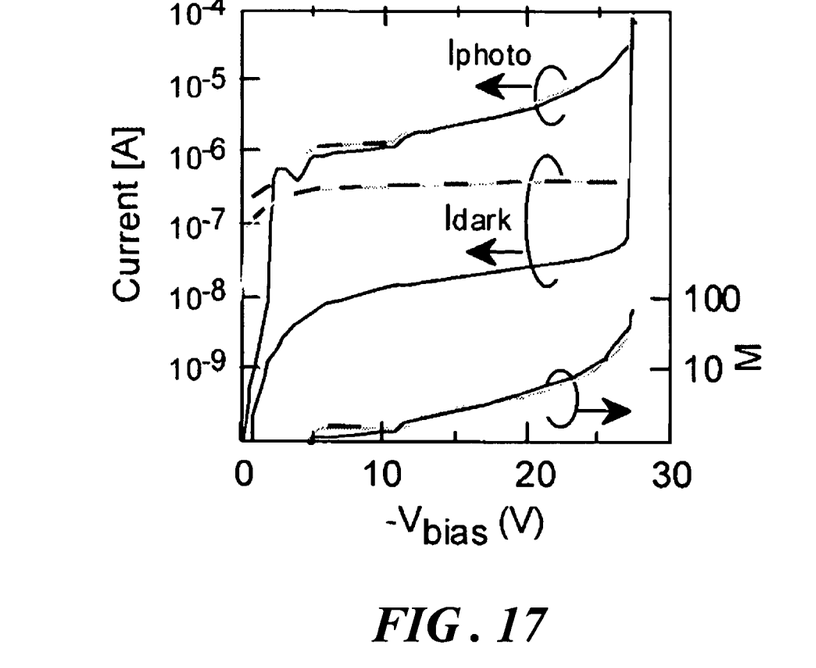
FIG. 17 is a characteristic graph representing the relationship between the current and the reverse bias voltage and the relationship between the multiplication factor M and the reverse bias voltage, with regard to an avalanche photodiode according to Embodiment 9 of the present invention.

Moreover, it is not necessary to perform the complete side removal up to the cleavage face 27; for example, as illustrated in FIG. 16, the side removal may be performed from the top side, in such a way that at least the light absorption layer out of the layers layered on the peripheral portion of the first conductivity-type substrate is removed, so as to form stopper grooves 30 partially in the layers. FIG. 17 is a characteristic graph representing the relationship between the current and the reverse bias voltage and the relationship between the multiplication factor M and the reverse bias voltage in the case where the stopper grooves 30 are provided. In FIG. 17, the broken line represents the dark current characteristic of an avalanche photodiode, according to Embodiment 1, which has been element-separated through simple cleavage, instead of the side removal. Because, by providing the stopper groove 30, the spread of the depletion region changes, the photoelectric current ($I_{photo}$ in FIG. 17) temporarily decreases; however, it can be seen that, as is the case with Embodiment 4, the dark current can be reduced to be on the order of $10^{-8}$ A ($I_{dark}$ in FIG. 17).

In addition, the shape of the stopper groove 30 is not limited in particular; the stopper groove 30 may be formed in a ring shape or in a track shape. The ring shape includes not only a shape obtained by making a groove around a circular central portion, but also a shape obtained by making a groove around the rectangular or polygonal central portion. It is preferable to round the corner portions so as to prevent electric fields from converging into the corner portions. Similarly, the track shape denotes a shape obtained by surrounding both the ends of a rectangle with semicircles and making a groove around the central portion; the semicircle portion also includes a rectangular shape and a polygonal shape. Similarly, it is preferable to round the corner portions. In addition, the track shape also includes a shape obtained by making a groove around an ellipsoidal central portion.

Figure 18:
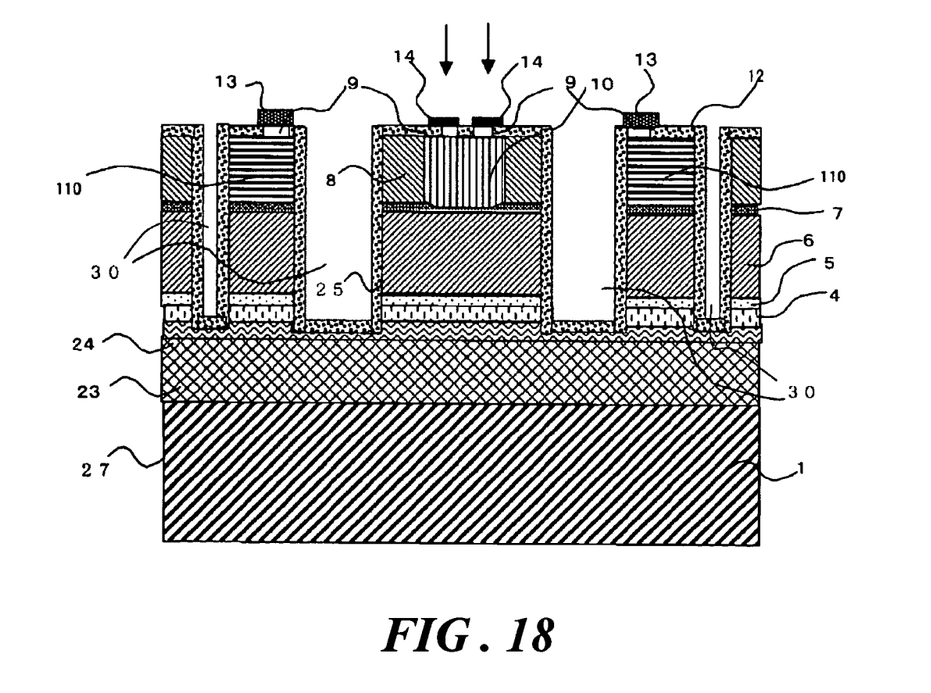
FIG. 18 is a cross-sectional view schematically illustrating a structure of an avalanche photodiode according to Embodiment 9 of the present invention.

Additionally, as illustrated in FIG. 18, a second stopper groove 30 may be provided in addition to the stopper groove 30. By providing a plurality of stopper grooves 30, the inner portion of the avalanche photodiode can be protected against a chip or a scratch that are caused during handling, the yield rate and the reliability can be raised.

Additionally, by pulling up the n electrode 13 to the top side, the mounting is further facilitated. The p-type peripheral conductive region 110 may be provided in the peripheral portion.

In Embodiments 1 to 9, by utilizing a semi-insulating substrate 29 as the substrate 1, a surface incidence may be employed. In this case, because the electrostatic capacitance can be suppressed, the operational bandwidth can be widened.

In addition, in Embodiment 9, an example in which the stopper groove 30 is provided so that the n electrode 13 and the p electrode 14 are arranged on the element surface has been explained; however, the stopper groove 30 can be utilized as a means for applying the side removal to at least the light absorption layer among the layers which are layered on the portion, of the substrate, on which the second conductivity type conductive region 10 and the semiconductor layer 8 around the second conductivity type conductive region 10 are surrounded by that layers. In other words, it is also possible that, in an avalanche photodiode, according to the present invention, in which, on the bottom side of the substrate 1 in Embodiments 1 to 8, the first electrode 13 is provided, the stopper groove 30 is provided as the means for performing the side removal; the same effect of reducing the dark current can be demonstrated.

Embodiment 10

Figure 19:
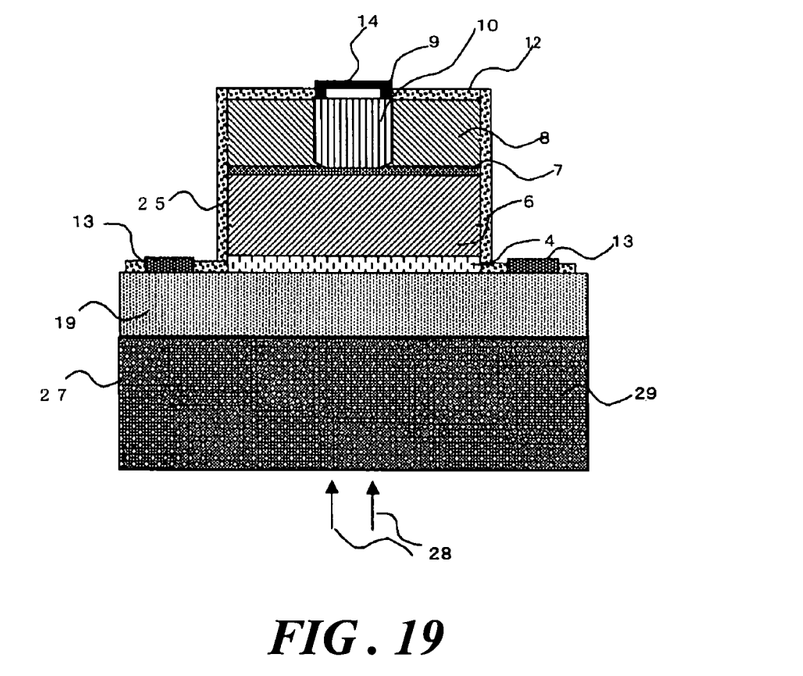
FIG. 19 is a cross-sectional view schematically illustrating a structure of an avalanche photodiode according to Embodiment 10 of the present invention.

FIG. 19 is a cross-sectional view schematically illustrating a structure of an avalanche photodiode according to Embodiment 10 of the present invention. In Embodiment 10, in the avalanche photodiode described in Embodiments 1 and 9, the Fe-doped semi-insulating substrate 29 of an InP or the like is utilized as the substrate 1. Additionally, the light beam 28 is made to enter through the semi-insulating substrate 29. As the laminating method for the semiconductor, for example, on the semi-insulating substrate 29, a buffer layer 19 of an n-type AlInAs having a carrier concentration of $2 \times 10^{18}$ cm$^{-3}$ to $2 \times 10^{19}$ cm$^{-3}$ was grown as thick as a predetermined thickness; an avalanche multiplication layer 4 of an i-type AlInAs, as thick as 0.1 μm to 0.3 μm; an electric-field relaxation layer 5 of a p-type InP having a carrier concentration of $1 \times 10^{17}$ cm$^{-3}$ to $2 \times 10^{18}$ cm$^{-3}$, as thick as 0.03 μm to 0.06 μm; a light absorption layer 6 of a p-type GaInAs having a carrier concentration of $1 \times 10^{15}$ cm$^{-3}$ to $5 \times 10^{15}$ cm$^{-3}$, as thick as 1.0 μm to 1.5 μm; a transition layer 7 of an i-type AlGaInAs, as thick as 0.02 μm to 0.2 μm; a second semiconductor layer 8 (that function as a cap layer in the case where a light beam is made to enter through the bottom side) of an i-type InP, as thick as 1.0 μm to 2.0 μm; a contact layer 9 of an i-type GaInAs was grown as thick as 0.1 μm to 0.4 μm; and then a p-type conductive region 10, a contact layer 9 of a GaInAs, and a p electrode 14 were formed. Furthermore, the side removal was performed up to the buffer layer 19 of an n-type AlInAs, a protection film 12 was provided in such a way as to cover the top side and the side face, and an n-type electrode 13 was formed in such a way as to come into contact with the buffer layer 19 of an n-type AlInAs.

Because the avalanche photodiode according to Embodiment 10 is configured as described above, the light beam 28 that has entered through the bottom side and has passed through the light absorption layer 6 can be reflected by the p electrode 14. Moreover, the n electrode 13 and the p electrode 14 are provided on the surface of the semi-insulating substrate 29 of an InP, it is made possible to perform the flip-chip mounting. Still moreover, by utilizing the Fe-doped semi-insulating substrate of an InP, the electrostatic capacitance can be reduced, whereby the speedup is made possible. The effect of suppressing the absorption by the substrate can be demonstrated. Furthermore, because the side face 25 is provided, the avalanche photodiode can be utilized as a side-face-incidence waveguide type photodiode, the element volume can be reduced.

In Embodiment 10, the light beam 28 is made to enter through the bottom side of the semi-insulating substrate 29; however, an antireflection film may be provided on the semi-insulating substrate 29. An n-type buffer/clad layer may be employed instead of the buffer layer 19 of an n-type AlInAs. A p-type peripheral conductive region 110 may be provided around the p-type conductive region 10.

In addition, in Embodiments 1 to 10, examples, in which an n-type as the first conductivity type, a p-type as the second conductivity type, an n electrode as the first electrode, and a p electrode as the second electrode are utilized, have been explained; however, a p-type as the first conductivity type, an n-type as the second conductivity type, a p electrode as the first electrode, and an n electrode as the second electrode may be utilized.

An example in which solid-phase diffusion is utilized for the formation of the conductive region 10 has been explained; however, gas-phase diffusion may be utilized. As the material for the n electrode 13 and the p electrode 14, an AuZn/Au, an AuGe/Ni/Au, or a Ti/Au may be utilized.

The avalanche multiplication layer 4 may be a GaInAsP superlattice, an AlInAs/AlGaInAs superlattice, or an AlInAs/GaInAsP superlattice.

In addition, in Embodiments 1 to 10, examples in which an Al-system material is utilized for the avalanche multiplication layer 4 has been explained; however, in the case where the multiplication layer is a p-type, holes drift to the multiplication layer; thus, an InP-system material, in which a hole can more be multiplied, can be utilized for the avalanche multiplication layer 4.

When not being required in particular, the electric-field relaxation layer 5 can be omitted; however, a material having a large bandgap is preferable. An InP and an AlInAs have a high ionization rate for a hole and an electron, respectively; therefore, in the case where a material having a higher ionization rate, e.g., an Al-system material such as an AlInAs is utilized for the avalanche multiplication layer 4, by utilizing the electric-field relaxation layer 5 of an AlInAs which also has a high ionization rate for an electron, superior properties can be obtained with regard to the operation speed and the noise.

The light absorption layer 6 may be an i-type, or an n conductivity type having a carrier concentration of $3 \times 10^{16}$ cm$^{-3}$ or lower. In addition, only the upper portion of the light absorption layer 6 may be an i-type or an n conductivity type.

The transition layer 7 may be of an AlInAs, or a GaInAsP.

The window layer 8 may be of an AlInAs, or a AlGaInAs. Additionally, the window layer 8 may be a Fe-doped semi-insulating type.

The contact layer 9 may be a non-conductive type. The contact layer 9 may be omitted if the conductive region 10 in the window layer 8 and the p electrode 14 can be brought into contact with each other.

In addition, an embodiment obtained by appropriately combining the respective embodiments 1 to 10 can demonstrate the same effects as described above.

The invention claimed is:

1. An avalanche photodiode, comprising:
   an i-type avalanche multiplication layer including Al;
   a light absorption layer disposed above a top surface of the avalanche multiplication layer with respect to a light beam;
   an i-type window layer disposed above a top surface of the light absorption layer with respect to the light beam;
   a p-type conductive region formed in an upper portion of the window layer and surrounded by the window layer;
   a p-type electric field relaxation layer disposed between the avalanche multiplication layer and the light absorption layer, the electric field relaxation layer having a higher carrier concentration than a carrier concentration of the light absorption layer;
   a first n-type electrode; and
   a second p-type electrode electrically connected to the p-type conductive region.

2. The avalanche photodiode according to claim 1, wherein peripheral ends of the electrical relaxation layer extend over peripheral boundary between the window layer and the conductive region in horizontal direction.

3. The avalanche photodiode according to claim 1, wherein the window layer is formed of a semiconductor material having a wider band gap than a material of the light absorption layer.

4. The avalanche photodiode according to claim 1, further comprising a protective film formed of an insulation material and disposed between the conductive region and the second electrode.

5. The avalanche photodiode according to claim 1, further comprising a stopper groove which reaches at least the electric field relaxation layer from the window layer.

6. The avalanche photodiode according to claim 5, further comprising an insulation layer disposed on an inner surface of the stopper groove.

7. The avalanche photodiode according to claim 5, wherein a shape of the stopper groove is ring-shape or track-shape.

8. The avalanche photodiode according to claim 5, further comprising a second stopper groove which reaches at least the electric field relaxation layer from the window layer.

* * * * *